US007561249B2

(12) United States Patent
Hayashi

(10) Patent No.: US 7,561,249 B2
(45) Date of Patent: Jul. 14, 2009

(54) EXPOSURE APPARATUS, EXPOSURE METHOD, AND DEVICE MANUFACTURING METHOD

(75) Inventor: Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 325 days.

(21) Appl. No.: 11/375,203

(22) Filed: Mar. 15, 2006

(65) Prior Publication Data
US 2006/0209281 A1 Sep. 21, 2006

(30) Foreign Application Priority Data
Mar. 18, 2005 (JP) .............................. 2005-080587

(51) Int. Cl.
*G03B 27/42* (2006.01)
*G03B 27/52* (2006.01)
(52) U.S. Cl. .......................................... 355/53; 355/30
(58) Field of Classification Search .................. 355/30, 355/52, 53, 55, 67
See application file for complete search history.

(56) References Cited

U.S. PATENT DOCUMENTS

| 5,610,683 | A * | 3/1997 | Takahashi ..................... 355/53 |
| 6,954,256 | B2 * | 10/2005 | Flagello et al. ............... 355/53 |
| 7,268,854 | B2 * | 9/2007 | Nagasaka ..................... 355/53 |
| 2004/0136494 | A1 | 7/2004 | Lof et al. ...................... 378/34 |
| 2006/0132731 | A1 * | 6/2006 | Jansen et al. .................. 355/30 |
| 2006/0164616 | A1 * | 7/2006 | Okada .......................... 355/53 |
| 2006/0209281 | A1 | 9/2006 | Hayashi ....................... 355/53 |
| 2006/0215137 | A1 | 9/2006 | Hasegawa et al. ............. 355/53 |

FOREIGN PATENT DOCUMENTS

| JP | 6-124873 | 5/1994 |
| JP | 2004-165666 | 6/2004 |
| WO | WO 99/49504 | 9/1999 |

* cited by examiner

*Primary Examiner*—Hung Henry Nguyen
(74) *Attorney, Agent, or Firm*—Fitzpatrick, Cella, Harper & Scinto

(57) ABSTRACT

An exposure apparatus for exposing a substrate to light via a reticle. The apparatus includes a projection optical system configured to project a pattern of the reticle onto the substrate, a stage configured to hold the substrate, a light transmitting member interposed between the stage and an end face of the projection optical system, a first fluid filling system configured to fill, with a first fluid, a first space between the light transmitting member and the end face of the projection optical system, and a second fluid filling system configured to fill, with a second fluid, a second space between the light transmitting member and the substrate. The first fluid is an inorganic fluid having a refractive index higher than a refractive index of pure water, and the second fluid is an inorganic fluid having a refractive index higher than a refractive index of pure water.

17 Claims, 14 Drawing Sheets

EXPOSURE APPARATUS, EXPOSURE METHOD, AND DEVICE MANUFACTURING METHOD

This application claims the benefit of Japanese Patent Application No. 2005-080587, filed on Mar. 18, 2005, which is hereby incorporated by reference herein in its entirety.

FIELD OF THE INVENTION

The present invention relates to an exposure apparatus and an exposure method for exposing a substrate to light via a reticle, and a device manufacturing method using the exposure apparatus and exposure method.

BACKGROUND OF THE INVENTION

A process of manufacturing a semiconductor device formed from a micropattern, such as an LSI or VLSI, adopts a reduction projection exposure apparatus, which reduces a pattern formed on a mask and projects and transfers it onto a substrate coated with a photosensitive agent. To increase the degree of integration of a semiconductor device, further micropatterning is required. The exposure apparatus takes a measure to realize micropatterning at the same time as the development of a resist process.

As a means for increasing the resolving power of an exposure apparatus, a method of shortening the wavelength of exposure light and a method of increasing the numerical aperture (NA) of a projection optical system are generally used. As for the wavelength of exposure light, a shift from a 365 nm i line to KrF excimer laser light having an oscillation wavelength of around 248 nm is in progress, and an ArF excimer laser, which emits light having an oscillation wavelength of around 193 nm, is being developed. A fluorine ($F_2$) excimer laser, which emits light having an oscillation wavelength of around 157 nm, is also under development.

On the other hand, a projection exposure method using a liquid immersion method or liquid immersion lithography as a technique for increasing the resolving power independently of the above methods is receiving a great deal of attention. Conventionally, the space between the end face (final surface) of a projection optical system and the surface of an exposure target substrate (e.g., a wafer) is filled with a gas. However, the liquid immersion method executes projection exposure while the space is filled with a liquid. The liquid immersion method can advantageously attain a resolution higher than that in the conventional methods. For example, assume that the liquid immersion method uses pure water (refractive index:1.33) as the liquid to be supplied to the space between the projection optical system and the wafer, and sets the maximum incident angle of a light beam imaged on the wafer equal to that in the conventional methods. In this case, the liquid immersion method increases the resolving power to 1.33 times that in the conventional methods, even when the wavelength of light emitted from a light source remains the same. This amounts to increasing the NA of the projection optical system in the conventional methods to 1.33 times. The liquid immersion method can attain a resolving power whose NA is one or more, which is practically impossible in the conventional methods.

Methods of filling, with a liquid, the space between the wafer surface and the end face of the projection optical system are roughly classified into two. Japanese Patent Laid-Open No. 06-124873 discloses an exposure apparatus using the first method, i.e., a method in which the end face of the projection optical system and the entire wafer are arranged in a liquid tank. WO 99/49504 and Japanese Patent Laid-Open No. 2004-165666 disclose an exposure apparatus using the second method, i.e., a local fill method, in which the liquid is supplied only to the space between the projection optical system and the wafer surface.

As described above, the liquid immersion method executes projection exposure by filling, with the liquid, the space between the end face of the projection optical system and the surface of the exposure target substrate (e.g., a wafer). This makes it possible to attain a resolving power whose NA is one or more, which is practically impossible in the conventional methods. If pure water is used as the liquid, the liquid immersion method can attain a resolving power 1.33 times that in the conventional methods, because the refractive index of pure water is 1.33. If, however, a liquid having a refractive index higher than that of pure water is used, it is possible to attain a resolution higher than that in the use of pure water. Unfortunately, most of currently available liquids having a high refractive index are substances having a property of corroding a substrate and a stage, although they do not contaminate optical components, or substances having a property of contaminating the optical components, although they do not corrode the substrate and the stage. Therefore, it is problematic to use such a liquid as the immersion liquid.

SUMMARY OF THE INVENTION

The present invention has been made in consideration of the above background, and has as its exemplary object to make it possible to increase the degree of freedom to select an immersion fluid and, more specifically, to make it possible to use a fluid other than pure water.

According to a first aspect of the present invention, there is provided an exposure apparatus for exposing a substrate to light via a reticle. The apparatus comprises a projection optical system configured to project a pattern of the reticle onto the substrate, a stage configured to hold the substrate, a light-transmitting member interposed between the stage and an end face of the projection optical system, a first fluid filling system configured to fill, with a first fluid, a first space between the light-transmitting member and the end face of the projection optical system, and a second fluid filling system configured to fill, with a second fluid, a second space between the light-transmitting member and the substrate.

According to a preferred embodiment of the present invention, the first fluid filling system can include a first supply system configured to supply the first fluid to the first space, and a first recovery system configured to recover the first fluid supplied to the first space, and the second fluid filling system can include a second supply system configured to supply the second fluid to the second space, and a second recovery system configured to recover the second fluid supplied to the second space.

According to a preferred embodiment of the present invention, the apparatus can further comprise at least one of a first seal mechanism configured to seal the first space and a second seal mechanism configured to seal the second space.

According to a preferred embodiment of the present invention, the first seal mechanism can be configured to generate a gas curtain.

According to a preferred embodiment of the present invention, the first seal mechanism can include a first partition configured to partition the first space from outside of the first space.

According to a preferred embodiment of the present invention, the second seal mechanism can be configured to generate a gas curtain.

According to a preferred embodiment of the present invention, the second seal mechanism can include a second partition configured to partition the second space from outside of the second space.

According to a preferred embodiment of the present invention, an inorganic liquid can be used as the first fluid, and an organic liquid can be used as the second fluid.

According to a preferred embodiment of the present invention, a liquid having a refractive index higher than a refractive index of pure water can be used as the first fluid and the second fluid.

According to a preferred embodiment of the present invention, a liquid which contaminates the end face of the projection optical system less than the second fluid can be used as the first fluid, and a liquid which corrodes the substrate less than the first fluid can be used as the second fluid.

According to a second aspect of the present invention, there is provided an exposure method of exposing a substrate, held by a stage, to light, via a reticle and a projection optical system. The method comprises a first fluid filling step of filling, with a first fluid, a first space between an end face of the projection optical system and a light-transmitting member interposed between the stage and the end face, a second fluid filling step of filling, with a second fluid that is different from the first fluid, a second space between the light-transmitting member and the substrate, and an exposure step of exposing the substrate to light via the reticle, the projection optical system, the first fluid, the light-transmitting member, and the second fluid.

According to a third aspect of the present invention, there is provided a method of manufacturing a device, the method comprising steps of exposing a substrate to light using the above exposure apparatus, developing the exposed substrate, and processing the developed substrate to manufacture the device.

According to a fourth aspect of the present invention, there is provided a method of manufacturing a device, the method comprising steps of exposing a substrate to light in accordance with the above exposure method, developing the exposed substrate, and processing the developed substrate to manufacture the device.

The present invention makes it possible to increase the degree of freedom to select a fluid to be used for exposure and, more specifically, to use a fluid other than pure water. The use of a fluid having a refractive index higher than that of pure water contributes to transfer of a pattern onto a substrate with a resolution higher than that in the use of pure water.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

An exposure apparatus according to the present invention is preferably used to form a latent image pattern on a photosensitive agent, by projecting an original pattern onto the photosensitive agent applied to a substrate, such as a wafer, for semiconductor device manufacture or a glass plate for liquid crystal display device manufacture. The exposure apparatus according to the present invention may comprise a projection optical system, which projects a pattern formed on an original, such as a reticle, onto a substrate, such as a wafer or glass plate, a stage which supports the substrate, a light-transmitting member or a light-transmissive member (e.g., a plate-like optical element) interposed between the stage and the end face (a final optical element) of the projection optical system, a first liquid controller which fills, with a first liquid, the first space between the light-transmitting member and the end face of the projection optical system, and a second liquid controller which fills, with a second liquid, the second space between the light-transmitting member and the substrate.

The present invention is useful for any exposure apparatus and exposure method, to which a liquid immersion method of exposing a substrate using ultraviolet light as exposure light, while the space between a projection optical system and the substrate is filled with a liquid, is applied. The exposure apparatus may include an exposure apparatus (a so-called stepper), which transfers a pattern of an original plate onto a substrate fixed in position, or an exposure apparatus (a so-called scanner), which exposes a substrate to slit light to form a pattern of an original plate, while synchronously scanning the substrate and original plate.

An example in which the present invention is applied to a scanner will be described below as preferred embodiments of the present invention.

First Embodiment

Figure 1:
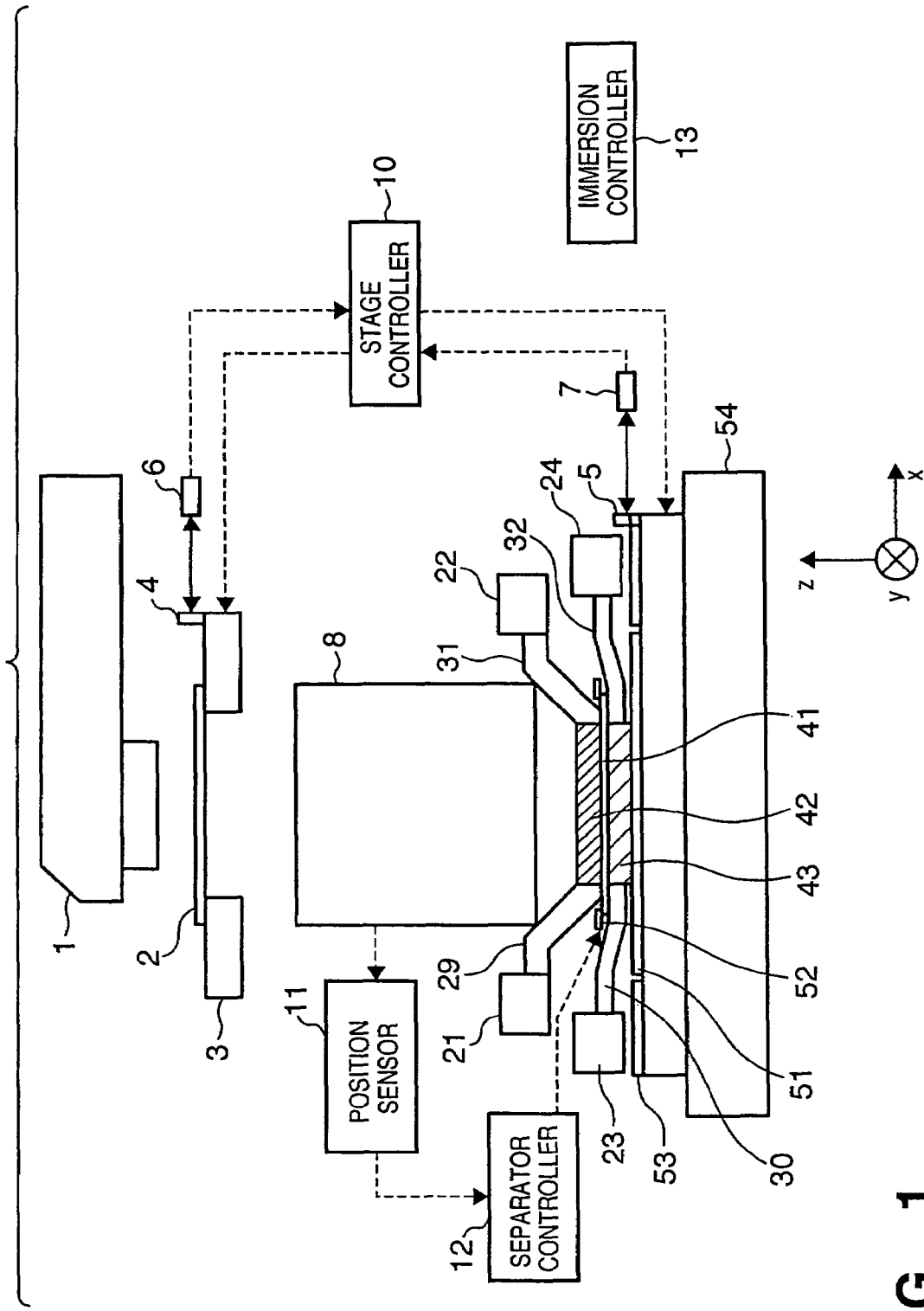
FIG. 1 is a view schematically showing the arrangement of an exposure apparatus according to the first embodiment of the present invention.

The first embodiment of the present invention will be described with reference to FIGS. 1 to 4. FIG. 1 is a view schematically showing the arrangement of an exposure apparatus according to the first embodiment of the present invention. Referring to FIG. 1, light emitted from an exposure light source (not shown), such as an ArF excimer laser or an $F_2$ laser, is provided to an illumination optical system 1. The illumination optical system 1 illuminates part of a reticle 2 (original plate) with slit light (light having a sectional shape such as that formed as the light transmits through a slit), using the light provided from the exposure light source. As the reticle is illuminated with the slit light, a reticle stage 3 (original plate stage), which holds the reticle 2 and a substrate stage 54 (wafer stage), which holds a substrate 51 (wafer) move by scanning in synchronism with each other. Through synchronous scanning, an image of the entire pattern on the reticle 2 is continuously formed on the substrate 51 through a projection optical system 8. A photoresist (photosensitive agent), applied to the surface of the substrate 51, is exposed to form a latent image pattern.

Reference mirrors 4 and 5 and laser interferometers 6 and 7 measure the two-dimensional positions of the reticle stage 3 and substrate stage 54, in real time. A stage controller 10 aligns and synchronously controls the reticle 2 (reticle stage) and substrate 51 (substrate stage 54). The substrate stage 54 incorporates a driver, which adjusts, changes, or controls the vertical position, rotation direction, and inclination of the substrate 51. This driver controls the substrate stage 54, in exposure, such that the focal plane of the projection optical system 8 is always matched with an exposure area on the substrate 51, with high accuracy. At this time, the vertical position and inclination of the surface of the substrate 51 are measured by a light focus sensor (not shown) and sent to the stage controller 10.

The exposure apparatus main body is installed in an ambient chamber (not shown), to hold its ambient air at a predetermined temperature. Conditioned air, whose temperature is further separately controlled, is blown into the space which surrounds the laser interferometers 6 and 7 and the space which surrounds the projection optical system 8. This maintains the ambient temperature of the apparatus main body with a higher accuracy.

Figure 2:
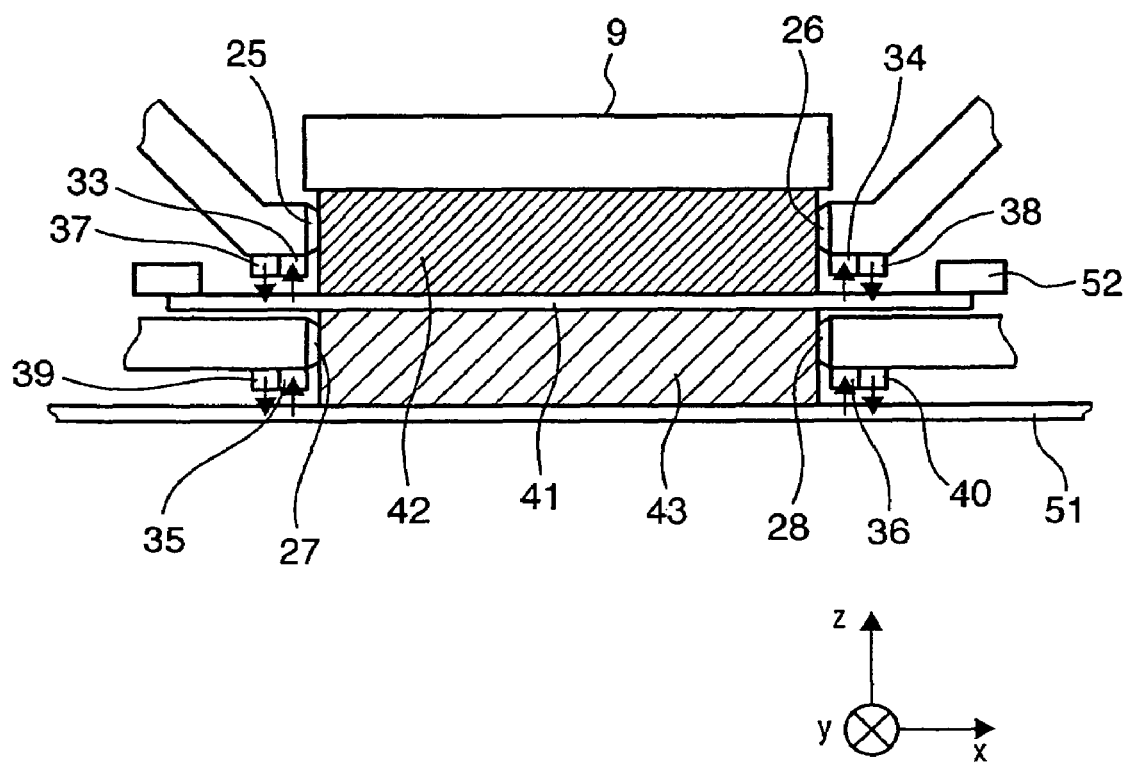
FIG. 2 is a view showing details of a final optical element, which forms the lower end face of a projection optical system, a substrate, and their peripheral portions, in the exposure apparatus shown in FIG. 1.

FIG. 2 is a view showing details of a final optical element 9, which forms the lower end face of the projection optical system 8, the substrate 51, and their peripheral portion, in FIG. 1. A light-transmitting member (separator) 41 is interposed between the final optical element 9 and the substrate 51, to divide the space between the final optical element 9 and the substrate 51 into two. In this case, the light-transmitting member 41 may be an optical element having, for example, a plate-like shape and a property of transmitting exposure light (e.g., ArF excimer laser light or $F_2$ laser light). The light-transmitting member 41 need not be wholly made of a light-transmitting material. It suffices if only an area to which the exposure light is to be transmitted is made of a light-transmitting material.

The first space between the final optical element 9 and the light-transmitting member 41 is filled with a first liquid 42, and the second space between the light-transmitting member 41 and the substrate 51 is filled with a second liquid 43. The light-transmitting member 41 is mechanically separated from the projection optical system 8 and substrate stage 54, and is supported by a support member 52.

The support member 52 may comprise an actuator (not shown). The position and inclination of the support member 52 can be controlled by causing a separator controller 12 to activate the actuator on the basis of an output signal from a sensor 11, which measures the positions of the projection optical system 8 and light-transmitting member 41. Moreover, even if turbulence is generated in the second liquid 43 upon driving the substrate stage 54, and propagates to the light-transmitting member 41 as a fluidic force, the separator controller 12 and actuator always hold the light-transmitting member 41 static, when viewed from the projection optical system 8.

The first space between the final optical element 9 and the light-transmitting member 41 is filled with the first liquid 42 by a first liquid controller, including a first liquid supply port 25, first supply pipe 29, first liquid supply device 21, first liquid recovery port 26, first recovery pipe 31, and first liquid recovery device 22. The second space between the light-transmitting member 41 and the substrate 51 is filled with the second liquid 43 by a second liquid controller, including a second liquid supply port 27, second supply pipe 30, second liquid supply device 23, second liquid recovery port 28, second recovery pipe 32, and second liquid recovery device 24.

Figure 3:
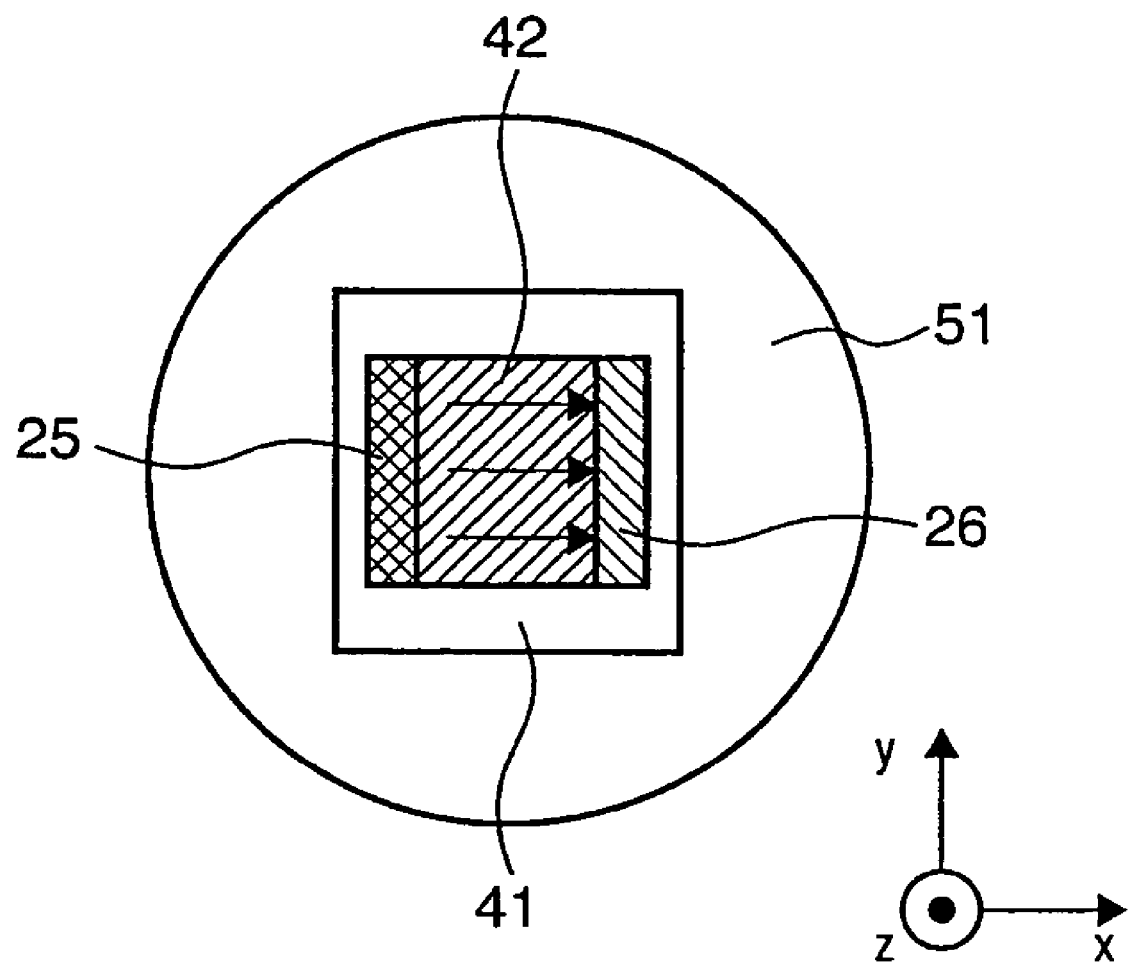
FIG. 3 is a view when a first liquid supply port and a first liquid recovery port, arranged for the first space between the final optical element and a light-transmitting member in the exposure apparatus shown in FIG. 1, are viewed from above.
Figure 4:
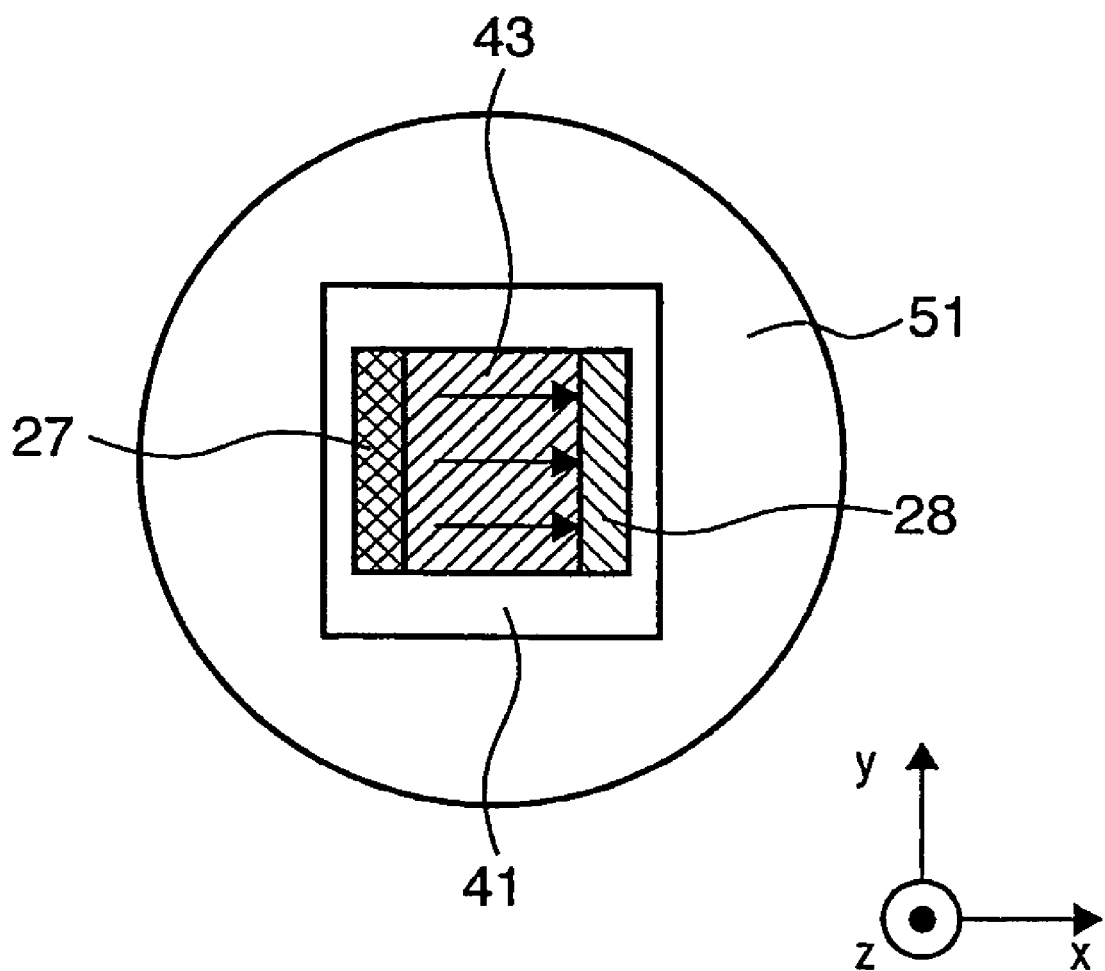
FIG. 4 is a view when a second liquid supply port and a second liquid recovery port, arranged for the second space between the light-transmitting member and the substrate in the exposure apparatus shown in FIG. 1, are viewed from above.
Figure 5:
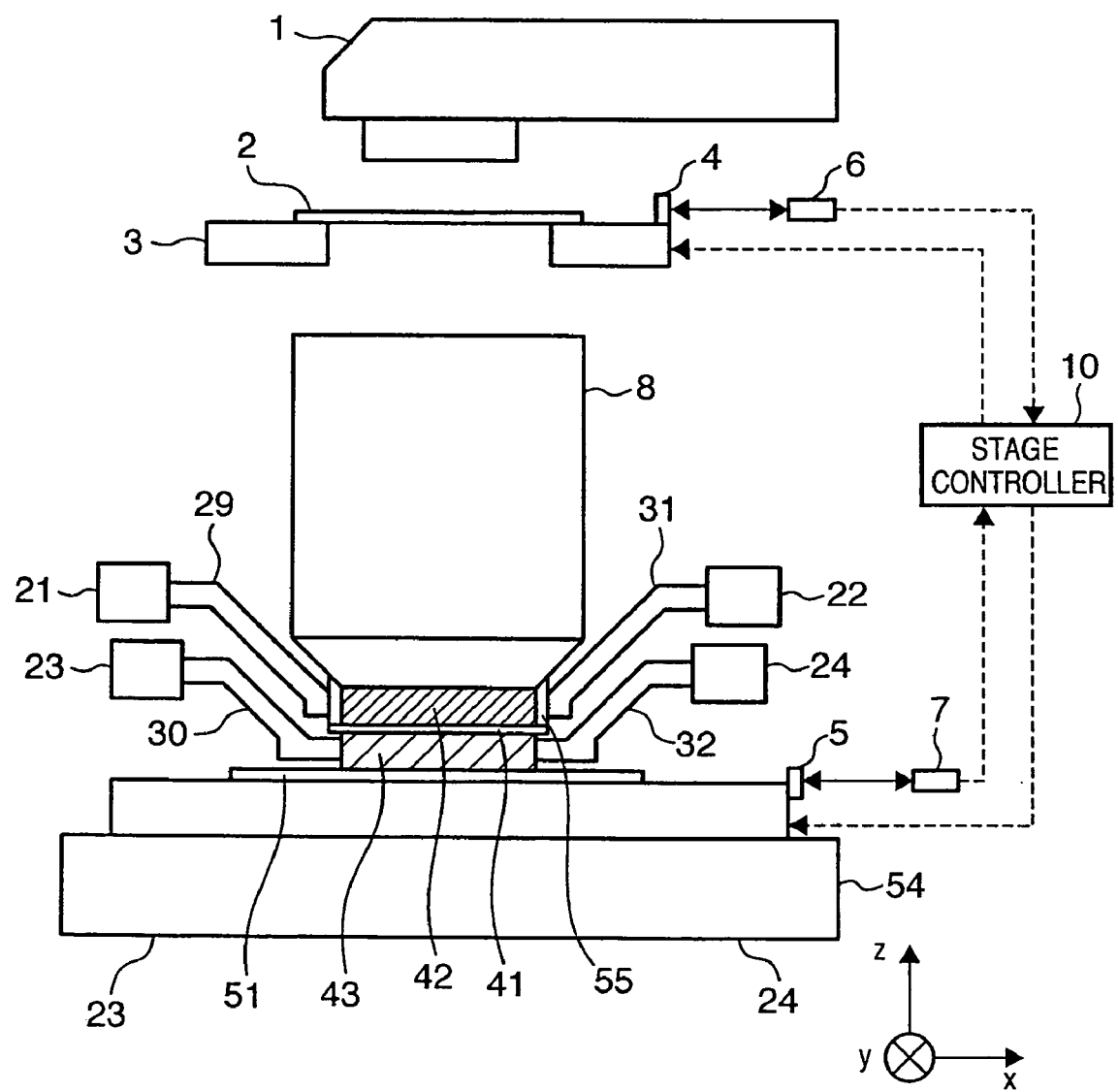
FIG. 5 is a view schematically showing the arrangement of an exposure apparatus according to the second embodiment of the present invention.
Figure 6:
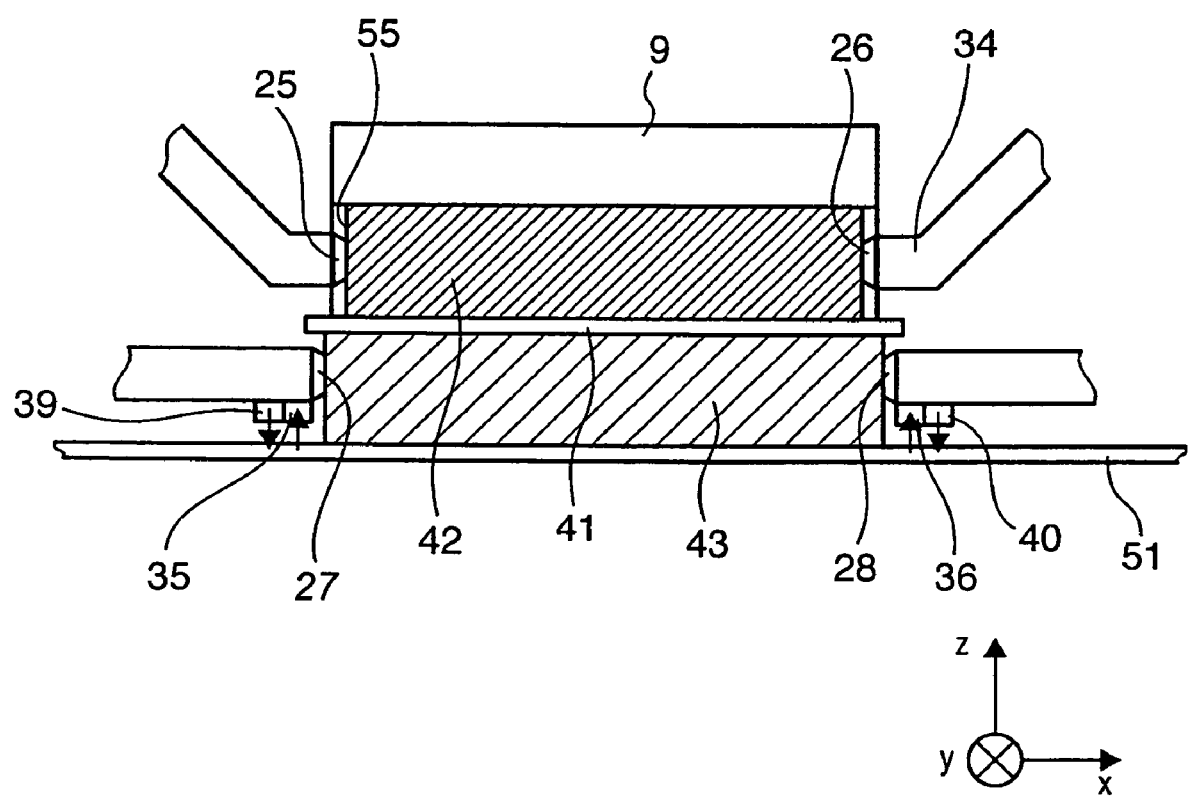
FIG. 6 is a view showing details of a final optical element, which forms the lower end face of a projection optical system, a substrate, and their peripheral portions, in the exposure apparatus shown in FIG. 5.

FIG. 3 is a view when the first liquid supply port 25 and first liquid recovery port 26, arranged for the first space between the final optical element 9 and the light-transmitting member 41, are viewed from above. FIG. 4 is a view when the second liquid supply port 27 and second liquid recovery port 28, arranged for the second space between the light-transmitting member 41 and the substrate 51, are viewed from above.

The first space (the space filled with the first liquid 42) and the outer space are preferably partitioned by an air curtain (partition). In this case, the air curtain functions as a seal mechanism, which seals the first space. The air curtain for the first space can be formed by gas supply ports 37 and 38 and gas recovery ports 33 and 34 arranged outside the first liquid supply port 25 and first liquid recovery port 26 (the outside when viewed from the first space). A gas is blown out through the gas supply ports 37 and 38 and recovered through the gas recovery units 33 and 34. The air curtain can prevent or suppress the first liquid 42 from leaking out from the first space to the outer space, or the gas vaporized from the first liquid 42 from spreading in the chamber.

Similarly, the second space (the space filled with the second liquid 43) and the outer space are preferably partitioned by an air curtain (partition). The air curtain for the second space can be formed by gas supply ports 39 and 40 and gas recovery ports 35 and 36 arranged outside the second liquid supply port 27 and second liquid recovery port 28 (the outside when viewed from the second space). A gas is blown out through the gas supply ports 39 and 40 and recovered through the gas recovery units 35 and 36. The air curtain can prevent or suppress the second liquid 43 from leaking out from the second space to the outer space, or the gas vaporized from the second liquid 43 from spreading in the chamber.

The first liquid supply port 25 is connected to the first liquid supply device 21 through the supply pipe 29. The first liquid recovery port 26 is connected to the first liquid recovery device 22 through the recovery pipe 31. The supply pipe 29 and recovery pipe 31 are mechanically separated from at least the light-transmitting member 41.

The second liquid supply port 27 is connected to the second liquid supply device 23 through the supply pipe 30. The second liquid recovery port 28 is connected to the second liquid recovery device 24 through the recovery pipe 32. The supply pipe 30 and recovery pipe 32 are mechanically separated from at least the substrate stage 54.

Each of the first and second liquid supply devices 21 and 23 may, for example, include a tank which stores a liquid, a pressure feed device which feeds the liquid, and a flow controller which controls the flow rate of the liquid to be supplied. Moreover, each of the first and second liquid supply devices 21 and 23 preferably includes a temperature controller to control the temperatures of liquids to be supplied to the first and second spaces. Each of the first and second liquid recovery devices 22 and 24 may, for example, include a tank which temporarily stores the recovered liquid, a suction device which draws the liquid by suction, and a flow controller to control the flow rate of the liquid to be recovered.

The exposure apparatus comprises an immersion controller 13. Upon receiving information about the current position, velocity, acceleration, target position, and moving direction of the substrate stage 54 from the stage controller 10, the immersion controller 13 gives a command to start/stop immersion or to control the flow rate of the liquid to the liquid supply devices 21 and 23 and liquid recovery devices 22 and 24, on the basis of the above information.

In order to allow the apparatus to start exposure from the edge of the substrate 51, it is necessary to stably fill, with the second liquid 43, the second space between the substrate 51 and the light-transmitting member 41, including a region around the periphery of the substrate 51. For this reason, a plate 53 (flush plate), almost flush with the substrate 51, is arranged at a portion outside the substrate 51 on the substrate stage 54.

A liquid having a high refractive index, which is used as the immersion liquid, should not absorb much exposure light, and additionally, should not contaminate the optical elements and corrode the substrate 51. However, it is difficult to develop a liquid having a high refractive index, which satisfies all the conditions. Of currently available liquids having a high refractive index, inorganic liquids (e.g., cesium sulfate: refractive index:1.49, and potassium sulfate: refractive index: 1.45), having a high refractive index have a property of corroding the substrate 51 and substrate stage 54, although they hardly contaminate the optical elements. Organic liquids (e.g., heptane: refractive index; 1.51, decane: refractive index:1.54, and glycerol: refractive index:1.6), having a high refractive index, have a property of contaminating the optical elements, although they hardly corrode the substrate 51 and substrate stage 54.

In view of this, when the above inorganic liquid having a high refractive index is used as the first liquid 42, it is possible to suppress contamination of the final optical element 9 of the projection optical system 8 within an allowable level. When the above organic liquid having a high refractive index is used as the second liquid 43, it is possible to suppress corrosion of the substrate 51 and substrate stage 54 within an allowable level. The first liquid 42 and second liquid 43 are separated by the light-transmitting member 41. This makes it possible to prevent or to suppress the substrate 51 and substrate stage 54 from being corroded by the first liquid 42. It is also possible to prevent or to suppress the final optical element 9 of the projection optical system 8 from being contaminated by the second liquid 43.

When the light-transmitting member 41 is contaminated by the organic liquid (second liquid 43) having a high refractive index, the light-transmitting member 41, contaminated, is detached from the support member 52, and replaced with a new one. This makes it possible to avoid degradation in exposure performance and throughput.

Preferably, dissolved gases are sufficiently removed from the first and second liquids for immersion, in advance, by using a degassing device. This is to suppress generation of air bubbles, and additionally, to immediately absorb air bubbles if they are, in fact, generated. For example, assume that the gases to be removed are nitrogen and oxygen contained in the ambient air in large quantities. When each gas is removed from the liquids by 80% or more of its dissolution limit, it is possible to sufficiently suppress generation of air bubbles. The exposure apparatus may comprise a degassing device (not shown) to supply the liquids to the liquid supply devices 21 and 23, while always removing the dissolved gasses from the liquids. As the degassing device, for example, a vacuum degassing device, which supplies a liquid to one side of a space partitioned by a gas-transmitting film and sets the other side in a vacuum state to discharge the dissolved gasses from the liquid through the film, is preferably used.

Second Embodiment

The second embodiment of the present invention will be described with reference to FIGS. 5 to 8. Points different from those in the first embodiment will be mainly described here. Details which are not particularly referred to can follow the first embodiment.

An exposure apparatus according to this embodiment includes a container 55, which divides the space between a final optical element 9 and a substrate 51 into the first space and a second space, and serves as a partition to partition the first space from the outer space. Parts of the container 55, e.g., the respective side walls communicate with a first liquid supply port 25 and first liquid recovery port 26.

At least part of the bottom of the container 55, more specifically, a portion to which exposure light is to be transmitted is made of a light-transmitting material 41. It suffices if the container 55 has a structure which can prevent or suppress a first liquid 42, supplied to the first space, from leaking out to the outer space, and can also prevent or suppress the first liquid 42 from mixing with a second liquid 43. For example, the container 55 can be formed as a container sealed, except for openings for the first liquid supply port 25 and first liquid recovery port 26. Alternatively, the container 55 can be formed as a container at least partially opening at the upper portion.

The second space between the container 55 (light-transmitting member 41) and the substrate 51 is filled with the second liquid 43 supplied through a second liquid supply port 27. The second liquid 43 in the second space is recovered through a second liquid recovery port 28.

The first liquid 42 and second liquid 43 are preferably always supplied/recovered during exposure to prevent or to suppress contamination of the optical elements (the final optical element 9 and light-transmitting member 41). When the light-transmitting member 41 is contaminated by the first liquid 42 and second liquid 43, it can be replaced with a new one to avoid degradation in exposure performance and throughput.

The first liquid supply port 25 is connected to a first liquid supply device 21 through a supply pipe 29. The first liquid recovery port 26 is connected to a first liquid recovery device 22 through a recovery pipe 31. The second liquid supply port 27 is connected to a second liquid supply device 23 through a supply pipe 30. The second liquid recovery port 28 is connected to a second liquid recovery device 24 through a recovery pipe 32. The supply pipe 30 and recovery pipe 32 are mechanically separated from at least a substrate stage 54.

The second space (the space filled with the second liquid 43) and the outer space are preferably partitioned by an air curtain (partition). The air curtain for the second space can be formed by gas supply ports 39 and 40 and gas recovery ports 35 and 36 arranged outside the second liquid supply port 27 and second liquid recovery port 28 (the outside when viewed from the second space). A gas is blown out through the gas supply ports 39 and 40 and recovered through the gas recovery units 35 and 36. The air curtain can prevent or suppress the second liquid 43 from leaking out from the second space to the outer space, or the gas vaporized from the second liquid 43 from spreading in the chamber.

Figure 7:
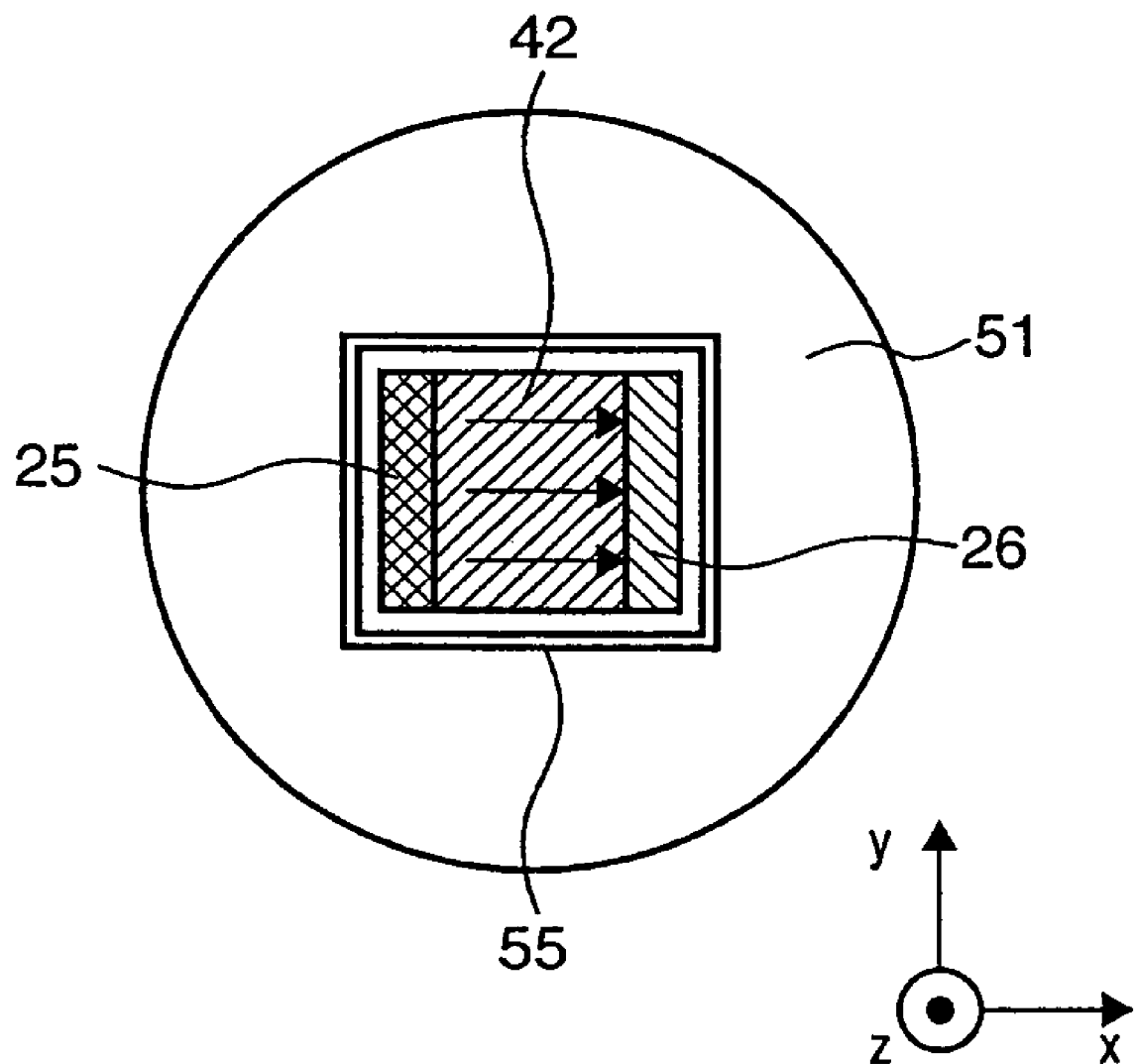
FIG. 7 is a view when a container, a first liquid supply port, and a first liquid recovery port, arranged for the first space between the final optical element and a light-transmitting member in the exposure apparatus shown in FIG. 5, are viewed from above.
Figure 8:
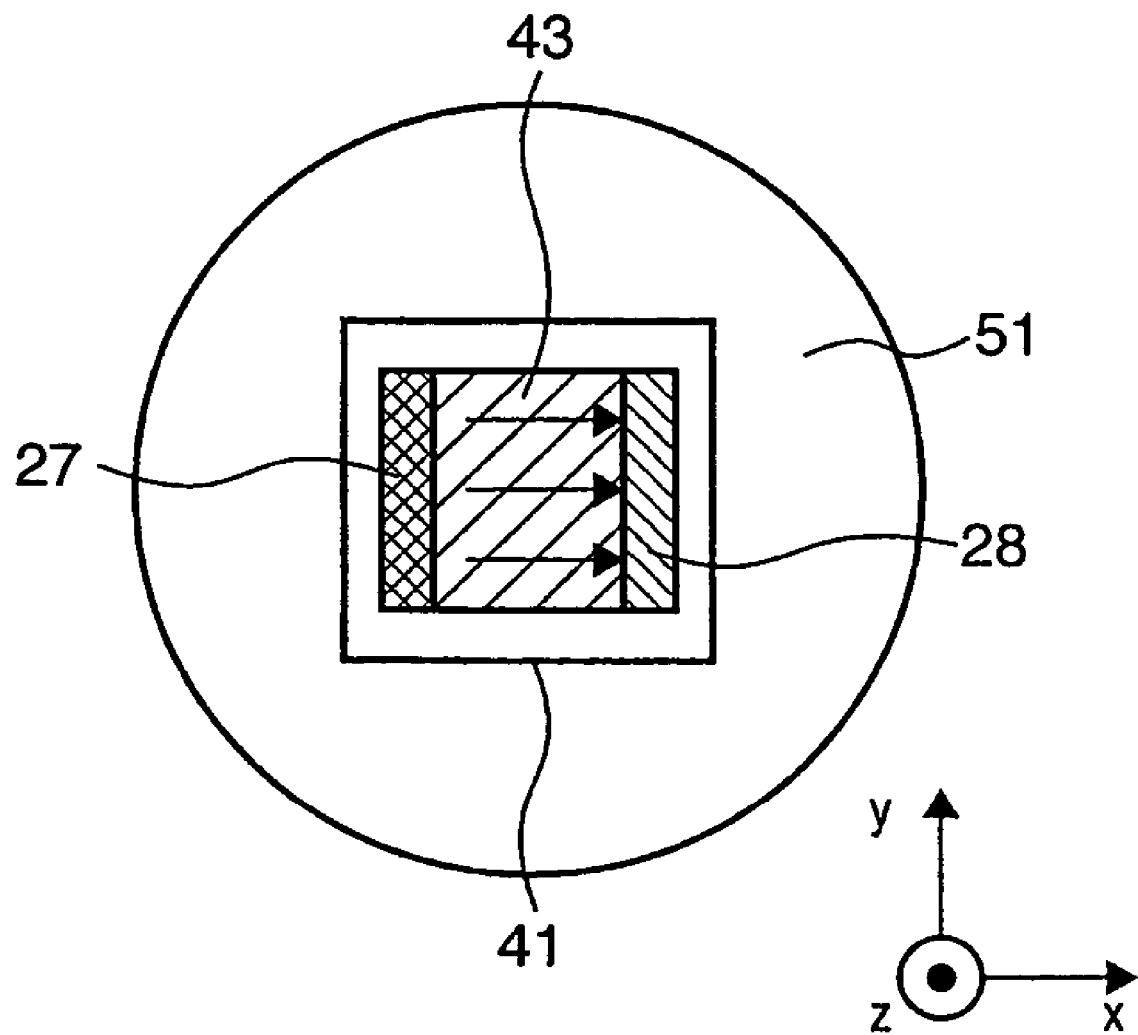
FIG. 8 is a view when a second liquid supply port and a second liquid recovery port, arranged for the second space between the light-transmitting member and the substrate in the exposure apparatus shown in FIG. 5, are viewed from above.
Figure 9:
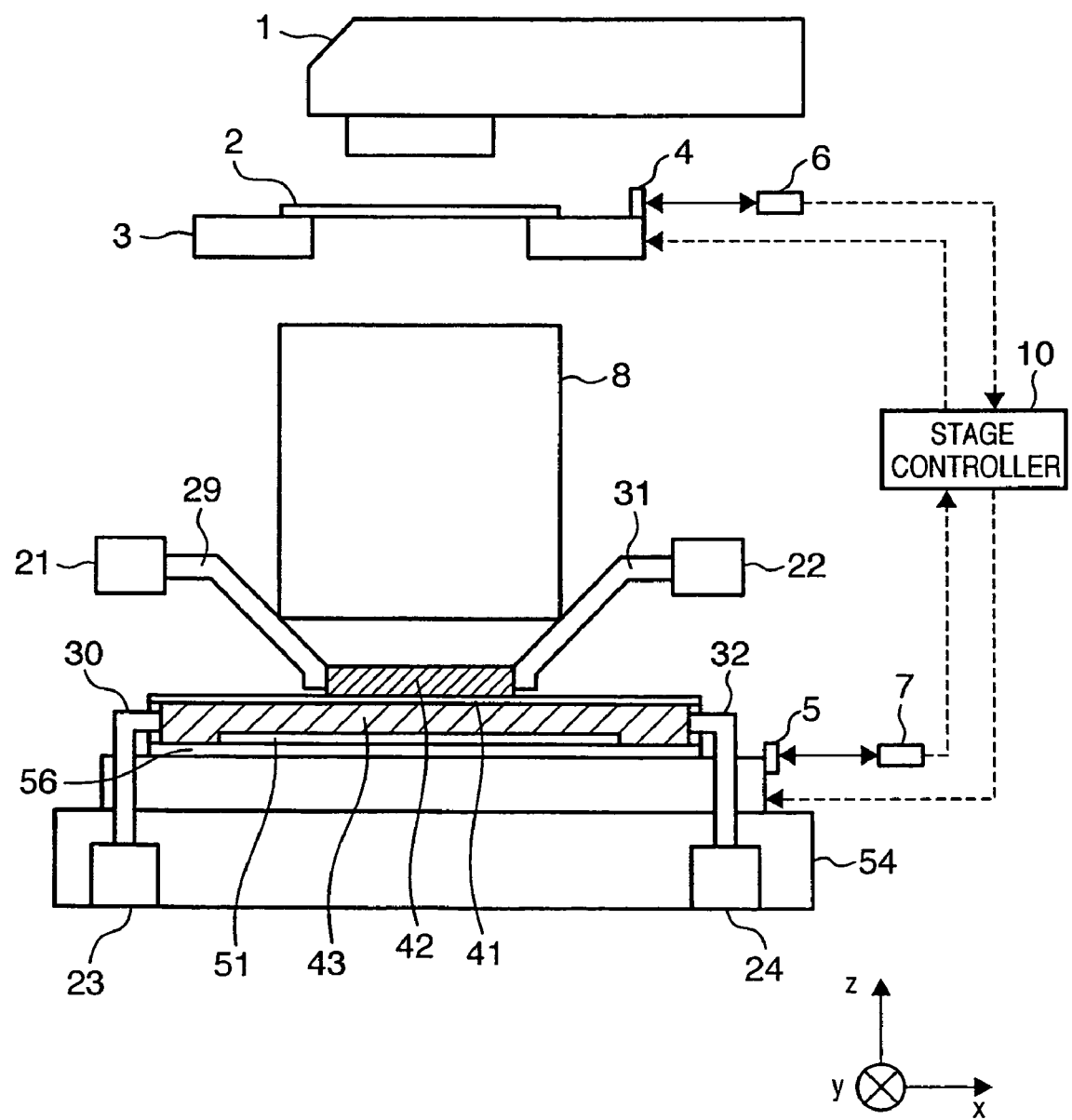
FIG. 9 is a view schematically showing the arrangement of an exposure apparatus according to the third embodiment of the present invention.
Figure 10:
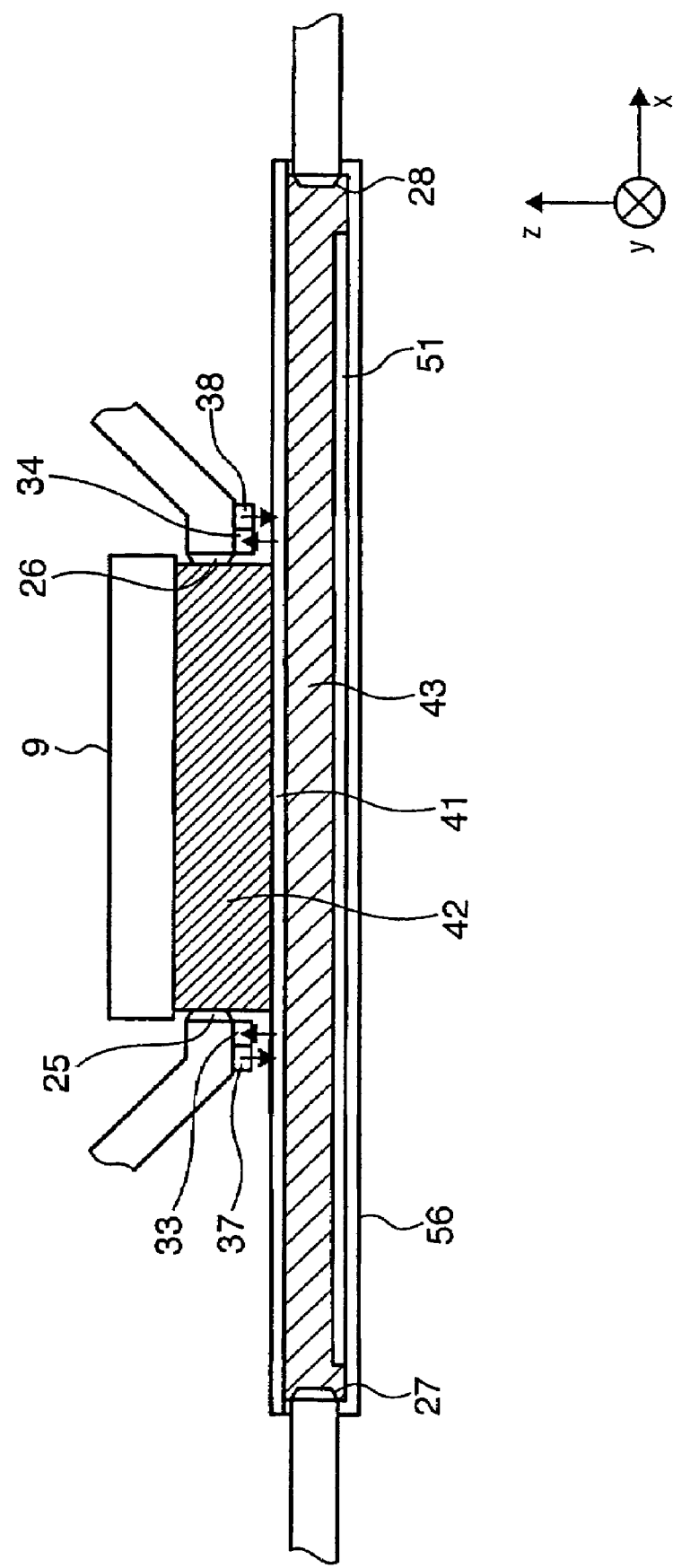
FIG. 10 is a view showing details of a final optical element, which forms the lower end face of a projection optical system, a substrate, and their peripheral portions, in the exposure apparatus shown in FIG. 9.

FIG. 7 is a view when the container 55, first liquid supply port 25, and first liquid recovery port 26, arranged for the first space between the final optical element 9 and the light-transmitting member 41, are viewed from above. FIG. 8 is a view when the second liquid supply port 27 and second liquid recovery port 28, arranged for the second space between the light-transmitting member 41 and the substrate 51, are viewed from above.

Third Embodiment

The third embodiment of the present invention will be described with reference to FIGS. 9 to 12. Points different from those in the first or second embodiment will be mainly described here. Details which are not particularly referred to can follow the first or second embodiment.

An exposure apparatus according to this embodiment includes a container 56, which separates the space between a final optical element 9 and a substrate 51 into the first space and second space, and serves as a partition to partition the second space from the outer space. Parts of the container 56, e.g., the respective side walls, communicate with a second liquid supply port 27 and second liquid recovery port 28.

At least part of the bottom of the container 56, more specifically, a portion to which exposure light is to be transmitted, is made of a light-transmitting material 41. It suffices if the container 56 has a structure, which can prevent or suppress a second liquid 43 supplied to the second space from leaking out to the outer space, and also prevent or suppress the second liquid 43 from mixing with a first liquid 42. For example, the container 56 can be formed as a container sealed, except for openings for the second liquid supply port 27 and second liquid recovery port 28.

The first liquid 42 and second liquid 43 are preferably always supplied/recovered during exposure to prevent or to suppress contamination of the optical elements (the final optical element 9 and light-transmitting member 41). When the light-transmitting member 41 is contaminated by the first liquid 42 and second liquid 43, it can be replaced with a new one, to avoid degradation in exposure performance and throughput. The container 56 may be replaced every time the substrate 51 is replaced. In this case, the container 56 may be replaced in the state in which the substrate 51 is accommodated in the container 56.

A first liquid supply port 25 is connected to a first liquid supply device 21 through a supply pipe 29. A first liquid recovery port 26 is connected to a first liquid recovery device 22 through a recovery pipe 31. The supply pipe 29 and recovery pipe 31 are mechanically separated from at least the light-transmitting member 41.

The second liquid supply port 27 is connected, through a supply pipe 30, to a second liquid supply device 23 attached to a substrate stage 54. The second liquid recovery port 28 is connected, through a recovery pipe 32, to a second liquid recovery device 24 attached to the substrate stage 54.

The first space (the space filled with the first liquid 42) and the outer space are preferably partitioned by an air curtain (partition). The air curtain for the first space can be formed by gas supply ports 37 and 38 and gas recovery ports 33 and 34, arranged outside the first liquid supply port 25 and first liquid recovery port 26 (the outside when viewed from the first space). A gas is blown out through the gas supply ports 37 and 38 and recovered through the gas recovery units 33 and 34. The air curtain can prevent or suppress the first liquid 42 from leaking out from the first space to the outer space, or the gas vaporized from the first liquid 42 from spreading in the chamber.

Figure 11:
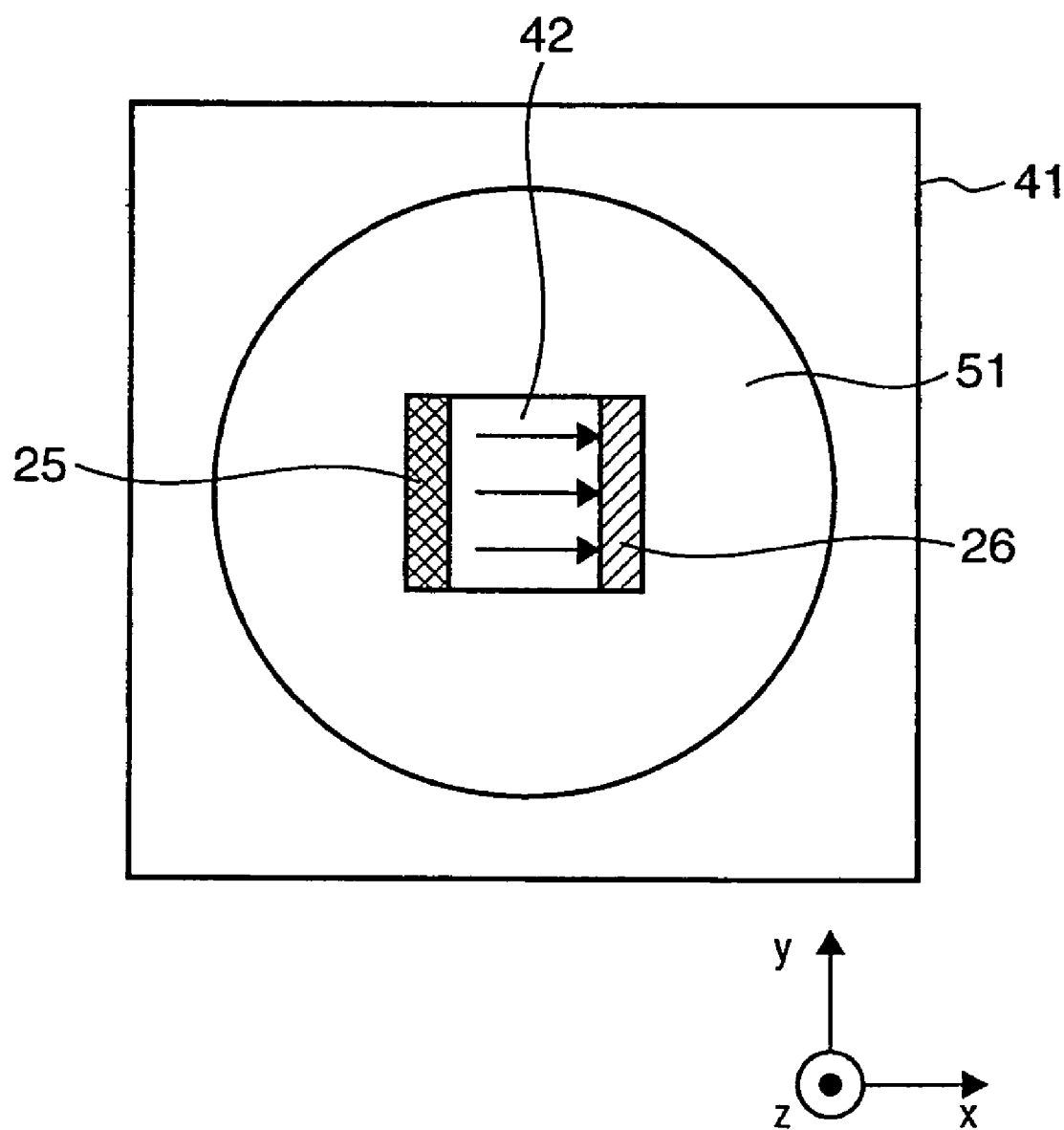
FIG. 11 is a view when a first liquid supply port and a first liquid recovery port, arranged for the first space between the final optical element and a light-transmitting member in the exposure apparatus shown in FIG. 9, are viewed from above.
Figure 12:
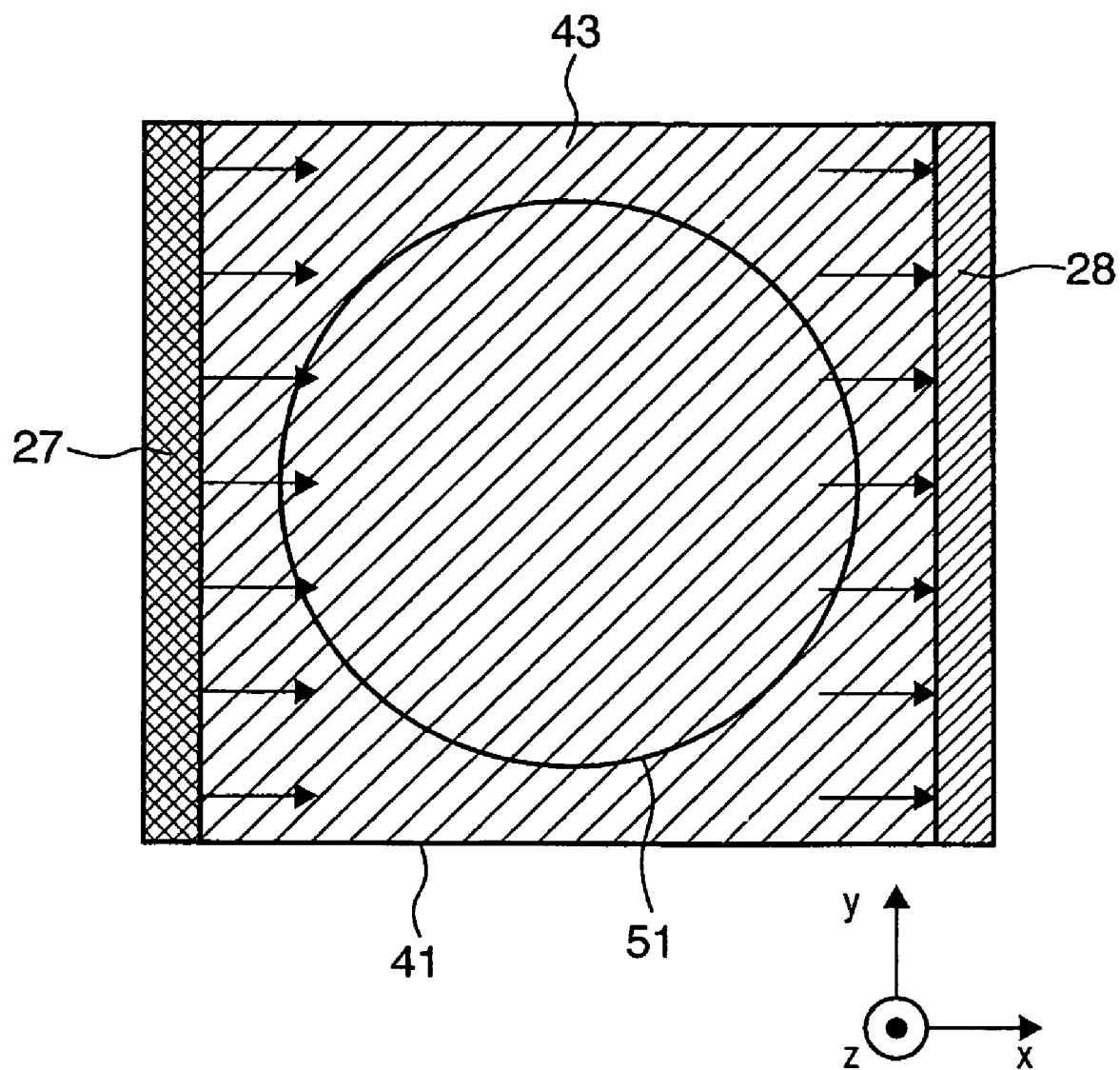
FIG. 12 is a view when a second liquid supply port and a second liquid recovery port, arranged for the second space between the light-transmitting member and the substrate in the exposure apparatus shown in FIG. 9, are viewed from above.

FIG. 11 is a view when the first liquid supply port 25 and first liquid recovery port 26, arranged for the first space between the final optical element 9 and the light-transmitting member 41, are viewed from above. FIG. 12 is a view when the second liquid supply port 27 and second liquid recovery port 28, arranged for the second space between the light-transmitting member 41 and the substrate 51, are viewed from above.

The above embodiments have been described as an example using a liquid. However, the present invention is not limited to using the liquid, and similar effects can be obtained even when a gas having similar properties is used.

Application Example

Figure 13:
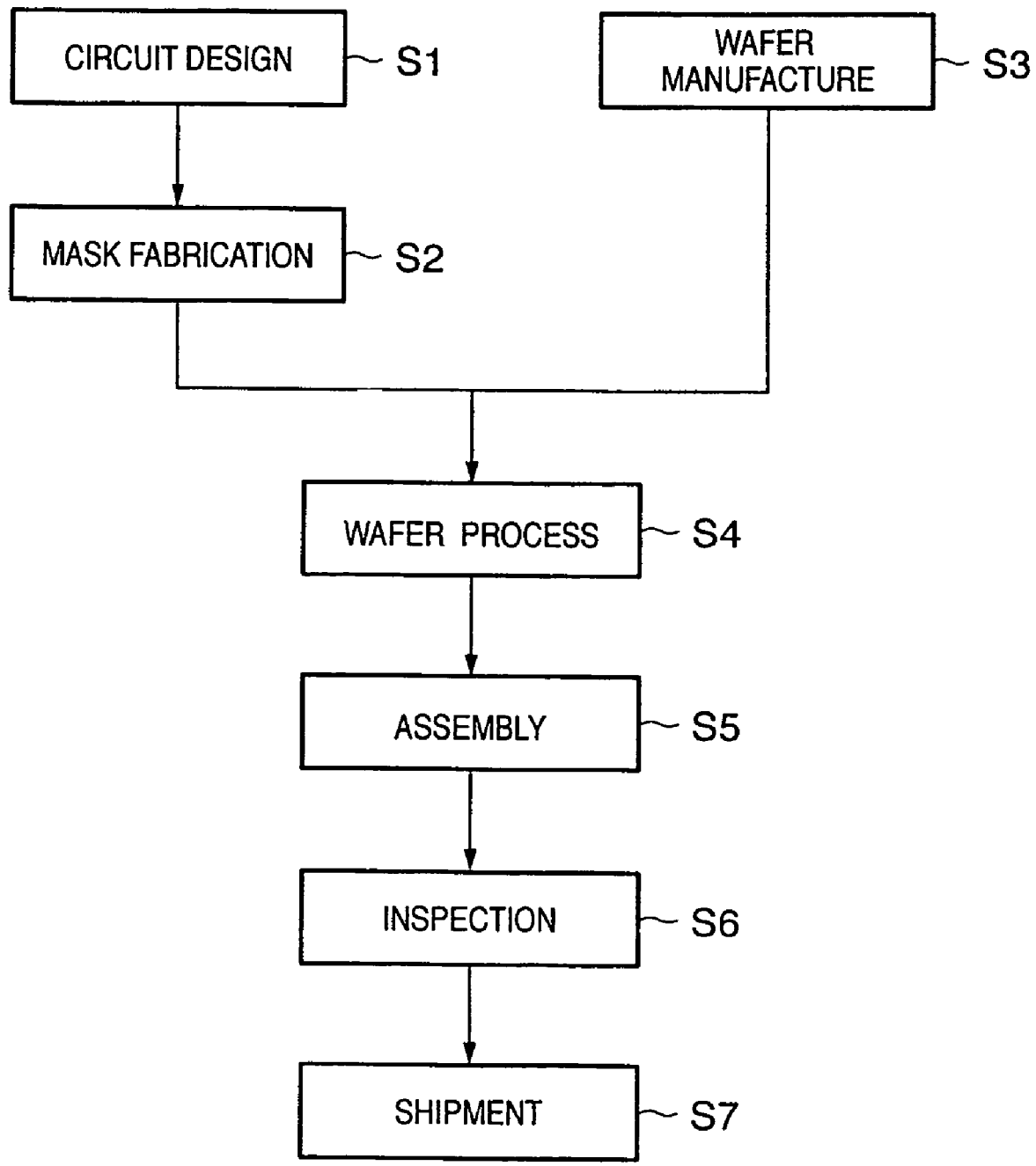
FIG. 13 is a flowchart showing the flow of the overall semiconductor device manufacturing process.

A semiconductor manufacturing process, as an example of a device manufacturing process using the above described exposure apparatus, will be described next. FIG. 13 is a flowchart showing the flow of the overall semiconductor device manufacturing process. In step S1 (circuit design), a semiconductor device circuit is designed. In step S2 (mask fabrication), a mask is fabricated on the basis of the designed circuit pattern. In step S3 (wafer manufacture), a wafer is manufactured using a material such as silicon. In step S4 (wafer process), called a pre-process, an actual circuit is formed on the wafer by lithography using the mask and wafer. In step S5 (assembly), called a post-process, a semiconductor chip is formed by using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped (step S7).

Figure 14:
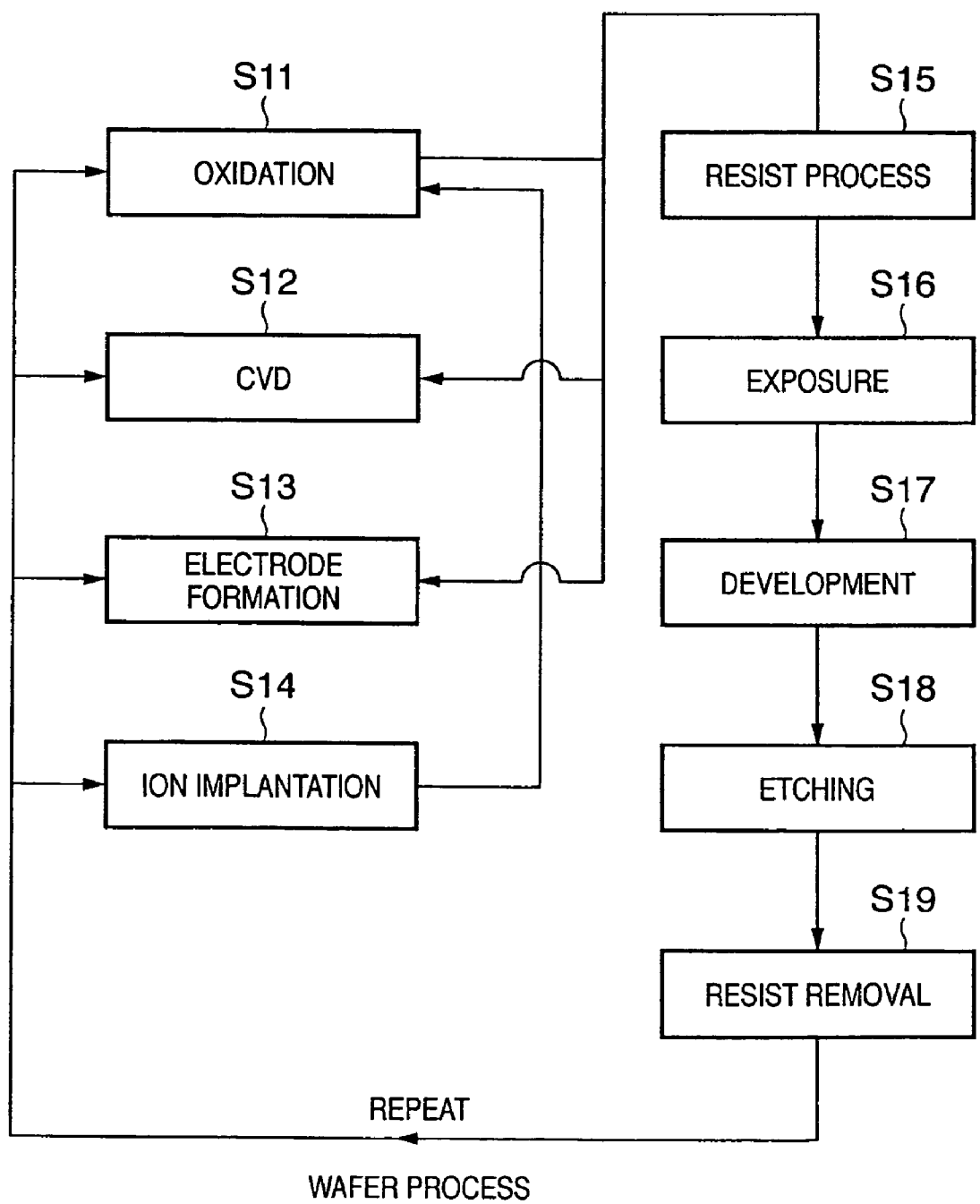
FIG. 14 is a flowchart showing the detailed flow of the wafer process.

FIG. 14 is a flowchart showing the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the above-described exposure apparatus transfers the circuit pattern onto the wafer. In step S17 (development), the exposed wafer is developed. In step S18 (etching), portions other than the developed resist image are etched. In step S19 (resist removal), any unnecessary resist remaining after the etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via a reticle, said apparatus comprising:
    a projection optical system configured to project a pattern of the reticle onto the substrate;
    a stage configured to hold the substrate;
    a light transmitting member interposed between said stage and an end face of said projection optical system;
    a first fluid filling system configured to fill, with a first fluid, a first space between said light transmitting member and the end face of said projection optical system, wherein the first fluid is an inorganic fluid having a refractive index higher than a refractive index of pure water;
    a second fluid filling system configured to fill, with a second fluid, a second space between said light transmitting member and the substrate, wherein the second fluid is an organic fluid having a refractive index higher than a refractive index of pure water;
    a sensor configured to measure a position of said light-transmitting member; and
    a controller configured to control the position of said light-transmitting member based on an output signal from said sensor.

2. An apparatus according to claim 1, wherein
said first fluid filling system includes a first supply system configured to supply the first fluid to the first space, and a first recovery system configured to recover the first fluid supplied to the first space, and
said second fluid filling system includes a second supply system configured to supply the second fluid to the second space, and a second recovery system configured to recover the second fluid supplied to the second space.

3. An apparatus according to claim 1, further comprising at least one of a first seal mechanism configured to seal the first space and a second seal mechanism configured to seal the second space.

4. An apparatus according to claim 3, wherein said first seal mechanism is configured to generate a gas curtain.

5. An apparatus according to claim 3, wherein said first seal mechanism includes a first partition configured to partition the first space from an outside of the first space.

6. An apparatus according to claim 3, wherein said second seal mechanism is configured to generate a gas curtain.

7. An apparatus according to claim 3, wherein said second seal mechanism includes a second partition configured to partition the second space from an outside of the second space.

8. An apparatus according to claim 1, wherein a liquid, which less contaminates the end face of said projection optical system than does the second fluid, is used as the first fluid, and a liquid, which less corrodes the substrate than does the first fluid, is used as the second fluid.

9. An exposure method of exposing a substrate held by a stage to light via a reticle and a projection optical system, said method comprising:
    a first fluid filling step of filling, with a first fluid, a first space between an end face of the projection optical system and a light transmitting member interposed between the stage and the end face, wherein the first fluid is an inorganic fluid having a refractive index higher than a refractive index of pure water;
    a second fluid filling step of filling, with a second fluid that is different from the first fluid, a second space between the light transmitting member and the substrate, wherein the second fluid is an organic fluid having a refractive index higher than a refractive index of pure water;
    an exposure step of exposing the substrate to light via the reticle, the projection optical system, the first fluid, the light transmitting member, and the second fluid;
    measuring a position of the light-transmitting member with a sensor; and
    controlling the position of the light-transmitting member based on an output signal from the sensor.

10. A method of manufacturing a device, said method comprising steps of:
    exposing a substrate to light using an exposure apparatus as defined in claim 9;
    developing the exposed substrate; and
    processing the developed substrate to manufacture the device.

11. A method of manufacturing a device, said method comprising steps of:
    exposing a substrate to light in accordance with an exposure method as defined in claim 9;
    developing the exposed substrate; and
    processing the developed substrate to manufacture the device.

12. An apparatus according to claim 1, wherein the first fluid is one of cesium sulfate and potassium sulfate, and the second fluid is one of heptane, decane, and glycerol.

13. A method according to claim 9, wherein the first fluid is one of cesium sulfate and potassium sulfate, and the second fluid is one of heptane, decane, and glycerol.

14. An apparatus according to claim 1, wherein the first fluid suppresses contamination of the end face of said projection optical system within an allowable level.

15. An apparatus according to claim 1, further comprising a controller configured to control temperature of the first fluid and temperature of the second fluid.

16. A method according to claim 9, wherein the first fluid suppresses contamination of the end face of the projection optical system within an allowable level.

17. A method according to claim 9, further comprising controlling a temperature of the first fluid and a temperature of the second fluid.

* * * * *